(12) United States Patent
Schrödinger

(10) Patent No.: US 7,454,190 B2
(45) Date of Patent: Nov. 18, 2008

(54) RECEIVER CIRCUIT FOR A RECEIVING ELEMENT

(75) Inventor: Karl Schrödinger, Berlin (DE)

(73) Assignee: Infineon Technologies AG, Munich (DE)

(*) Notice: Subject to any disclaimer, the term of this patent is extended or adjusted under 35 U.S.C. 154(b) by 763 days.

(21) Appl. No.: 10/976,051

(22) Filed: Oct. 28, 2004

(65) Prior Publication Data

US 2006/0104647 A1 May 18, 2006

(51) Int. Cl.
H04B 1/16 (2006.01)
(52) U.S. Cl. ................... 455/341; 455/334; 398/202; 330/98
(58) Field of Classification Search ............... 455/334, 455/341; 398/202, 203, 204, 205, 206, 207, 398/209; 330/98, 99, 100
See application file for complete search history.

(56) References Cited

U.S. PATENT DOCUMENTS 6,348,816 B1 * 2/2002 Havens et al. ............... 327/58
6,797,934 B2 * 9/2004 Kramer et al. ........... 250/214.1
7,057,457 B2 * 6/2006 Irvine et al. ................. 330/252
7,095,281 B2 * 8/2006 Zipper et al. ................ 330/261
2005/0275466 A1 * 12/2005 Dasgupta et al. ............ 330/308

OTHER PUBLICATIONS

"A Low-Power 20-GHz 52-dBΩ Transimpedance Amplifier in 80-nm CMOS", Christian Kromer, Gion Sialm, Thomas Morf, Martin L. Schmatz, Frand Ellinger, Daniel Erni and Heinz Jackel, IEEE Journal of Solid-State Circuits, vol. 39, No. 6, Jun. 2004, pp. 885-894.
"Low Noise Current-Mode CMOS Transimpedance Amplifier for Giga-Bit Optical Communication", S.M. Park and C. Toumazou, IEEE, ISCC, Conference Proceedings, 1998, pp. I-293-I-296.

* cited by examiner

Primary Examiner—Edward Urban
Assistant Examiner—Christian A Hannon
(74) Attorney, Agent, or Firm—Eschweiler & Associates, LLC

(57) ABSTRACT

A receiver circuit is disclosed which enables a reception signal fed into the receiver circuit by a reception element to be processed—e.g. amplified—with little to no errors. The receiver circuit has a cascode circuit on an input side, which cascode circuit generates an output signal from the reception signal of the reception element. Control means that act on the cascode circuit are connected to the cascode circuit. The control means are configured in such a way that they counteract an increase in a high level of the output signal of the cascode circuit on account of an excessively large input signal from the reception element.

23 Claims, 5 Drawing Sheets

Figure 1:
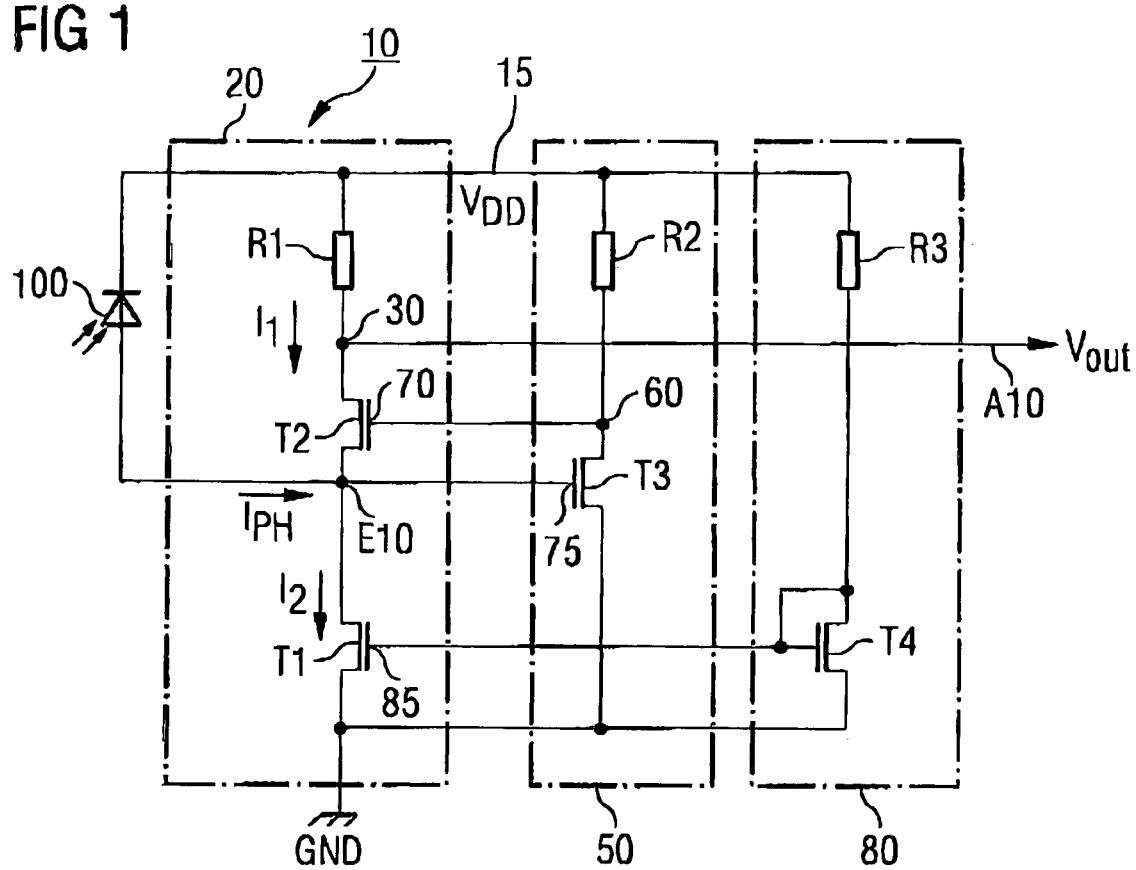

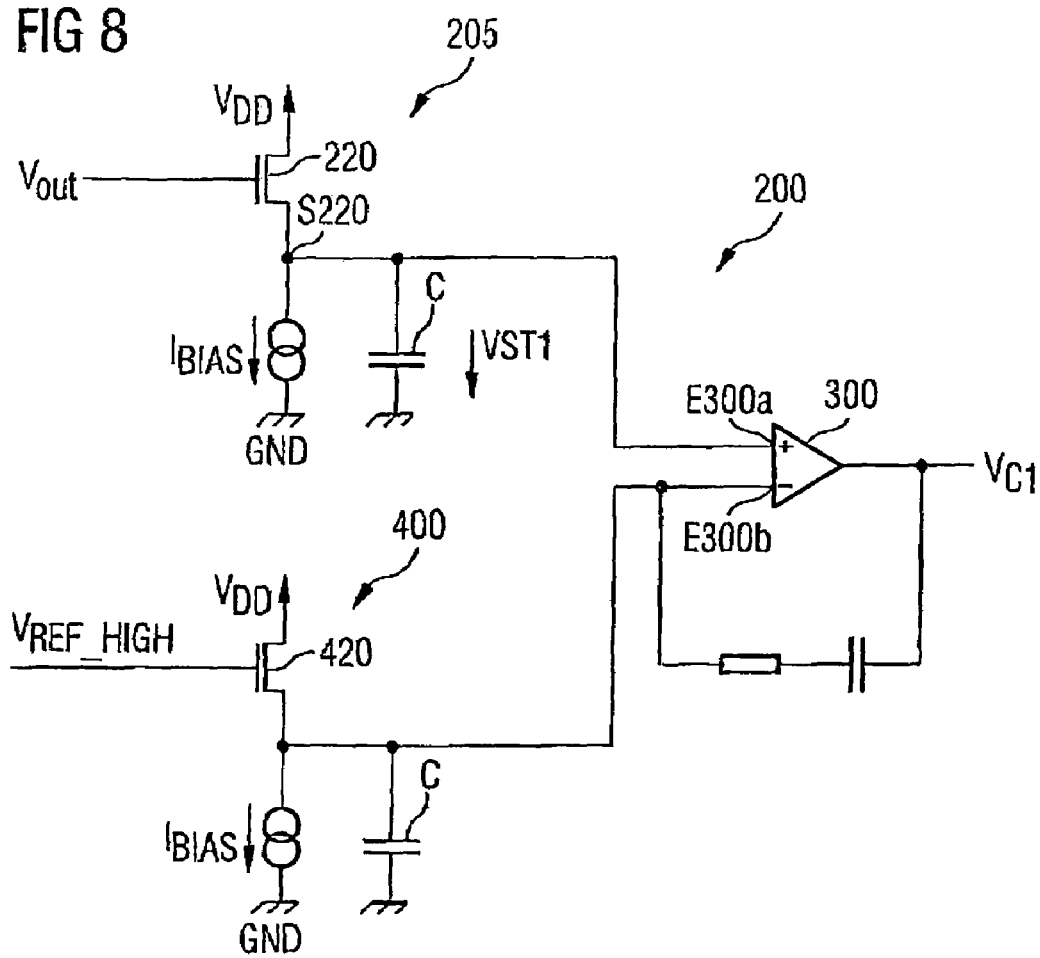
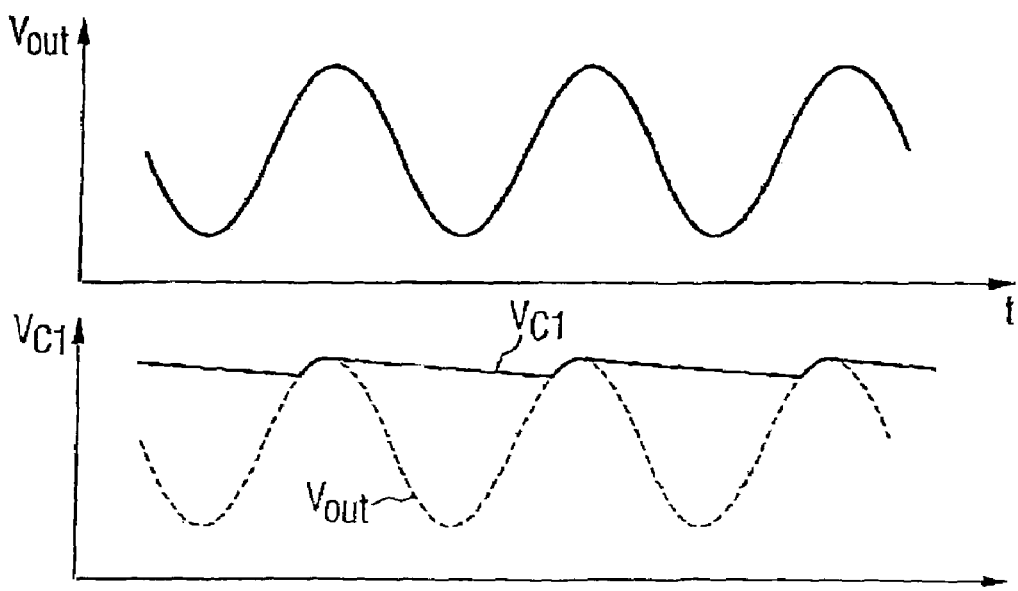

RECEIVER CIRCUIT FOR A RECEIVING ELEMENT

TITLE OF THE INVENTION

Receiver circuit for a receiving element.

1. Field of the Invention

The invention relates to a receiver circuit for a reception element, in particular for an optical reception element such as, by way of example, a photodiode or a phototransistor.

2. Background of the Invention

As is known, cascode circuits are used as receiver circuits for reception elements. Cascode circuits of this type are described for example in the following documents: "A Low-Power 20-GHz 52-dBΩ Transimpedance Amplifier in 80-nm CMOS" (Christian Kromer, Gion Sialm, Thomas Morf, Martin L. Schmatz, Frank Ellinger, Daniel Erni and Heinz Jäckel; IEEE Journal of Solid-State Circuits, Vol. 39, No. 6, June 2004, pp. 885-894) and "Low Noise Current-Mode CMOS transimpedance Amplifier for Giga-Bit Optical Communication" (S. M. Park and C. Toumazou; Integrated Solid State Circuit Conference (ISSCC) 1998, Conference Proceedings pp. S. I-293-I-296).

In this case, regulated cascode circuits, in particular, have proved successful for use in optical receiver circuits, and are likewise described in the documents cited.

Receiver circuits according to the "principle of the regulated cascode" are of interest primarily for "array" amplifiers, that is to say for amplifiers arranged in the form of an array, and also for future optical chip-to-chip connections; this is because this type of receiver circuits can be realized using CMOS technology and can therefore be constructed with minimal power loss and nevertheless with highly favorable noise properties and bandwidth properties. Furthermore, receiver circuits of this type can manage with very small supply voltages.

SUMMARY OF THE INVENTION

A receiver circuit is disclosed which, according to one or more aspects of the present invention, enables a reception signal that is fed into the receiver circuit, such as an optical data signal, for example, to be processed (e.g., amplified) with little to no errors. Additionally, one or more reception signals fed into an input side of the receiver circuit can be reliably processed even when the signals fluctuate in terms of magnitude, for example, becoming excessively large. More particularly, in the receiver circuit according to one or more aspects of the present invention, control means are connected to a cascode circuit of the receiver circuit, and serve to counteract an overdriving of the cascode circuit on account of an excessively large reception signal.

One essential advantage of the receiver circuit according to the invention is to be seen in the fact that, on account of the control means provided according to the invention, the cascode circuit remains "ready for operation"; this is because leaving the permissible operating range of the cascode circuit on account of an excessively large reception signal of the reception element is prevented.

A further essential advantage of the receiver circuit according to the invention consists in the fact that the control means additionally increase the dynamic range of the cascode circuit since they prevent overdriving.

ADVANTAGEOUS REFINEMENTS OF THE INVENTION

The control means are preferably configured in such a way that they counteract an increase in the high level of the output signal of the cascode circuit. In addition or as an alternative, they may also counteract an increase in the low level of the output signal of the cascode circuit. What is achieved by these measures is that the cascode circuit always generates an output signal that can be utilized further or "can be evaluated", mainly because the output levels of the output signal of the cascode circuit cannot become too large owing to the "counteracting" control means.

One advantageous refinement of the receiver circuit provides for an input path of the cascode circuit to have a series circuit comprising a first and a second transistor. A resistor is additionally connected to the second transistor. The electrical junction point between the first and second transistors forms an input of the receiver circuit. An output of the receiver circuit is formed by the electrical junction point between the resistor and the second transistor.

The control means are preferably configured in such a way that they reduce the resistance of the resistor already mentioned and also increase the transistor current through the first transistor in the event of a rise in the high level of the output signal.

In a corresponding manner, it is regarded as advantageous if the control means increase the resistance of the resistor and also reduce the transistor current of the first transistor in the event of a fall in the high level of the output signal. This has the effect that the high level remains in a predetermined level range or level interval.

The control means may for example evaluate the output voltage or the output current of the receiver circuit.

The cascode circuit is preferably a "regulated cascode" circuit. Such a "regulated cascode" circuit has a feedback path that reacts upon the input path of the cascode circuit. Such a feedback path may be formed for example by an additional transistor (called "third transistor" hereinafter) and an additional resistor (called "second resistor" hereinafter). The function of the feedback path of such a "regulated cascode" circuit consists in reducing the input resistance of the input path of the cascode circuit.

In the case of a cascode circuit, the "first" transistor of the input path already mentioned above is usually driven with a predetermined voltage in such a way that fixedly predetermined current flows through this "first" transistor. The setting of the current through this "first" transistor may be set for example by means of a current mirror path of the cascode circuit, which acts on the base or gate terminal of said "first" transistor (base terminal in the case of a bipolar transistor or gate terminal in the case of a field effect transistor).

Such a current mirror path may be formed for example by a resistor (called "third resistor" hereinafter) and a transistor (called "fourth transistor" hereinafter).

Preferably, the first and the third resistor are in each case formed by controllable resistor devices whose resistance can in each case be set by means of a control signal.

By way of example, the first controllable resistor is formed by a nonreactive resistor having a fixedly predetermined resistance and by a transistor (called "fifth transistor" hereinafter) connected in parallel therewith; this fifth transistor enables the resistance of this parallel circuit to be reduced.

Accordingly, the third resistor may likewise be formed by a nonreactive resistor having a fixedly predetermined further resistance and by a transistor ("sixth" transistor) connected in parallel. This sixth transistor enables the electrical resistance of the parallel circuit to be reduced and, consequently, the current through the first transistor to be increased.

The control means for controlling the cascode circuit preferably comprise a high level peak detector device and a low level peak detector device. In this case, the high level peak detector device is used for driving the fifth transistor already mentioned and the low level peak detector device is used for driving the sixth transistor already mentioned.

Both the high level peak detector device and the low level peak detector device may in each case be formed by, or comprise, a transistor, a capacitor and a current source.

Moreover, it is regarded as advantageous if a reference voltage can in each case be applied to the high level peak detector device and to the low level peak detector device, which reference voltage can be used to set a threshold value for the "activation" of said devices: By way of example, it is thus possible to prescribe a high level threshold value for the high level peak detector device and a low level threshold value for the low level peak detector device.

EXEMPLARY EMBODIMENTS OF THE INVENTION

Figure 2:
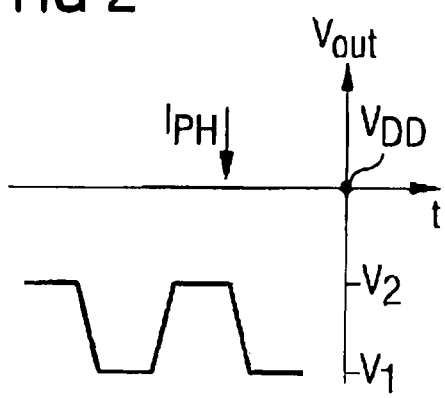
Figure 3:
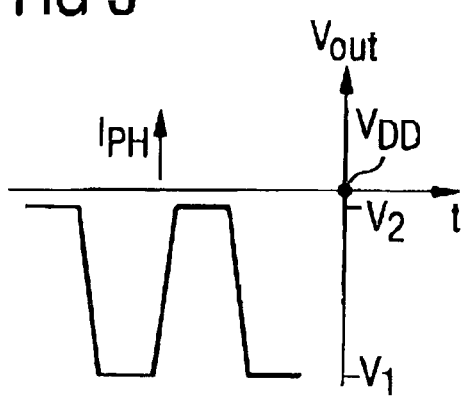
Figure 4:
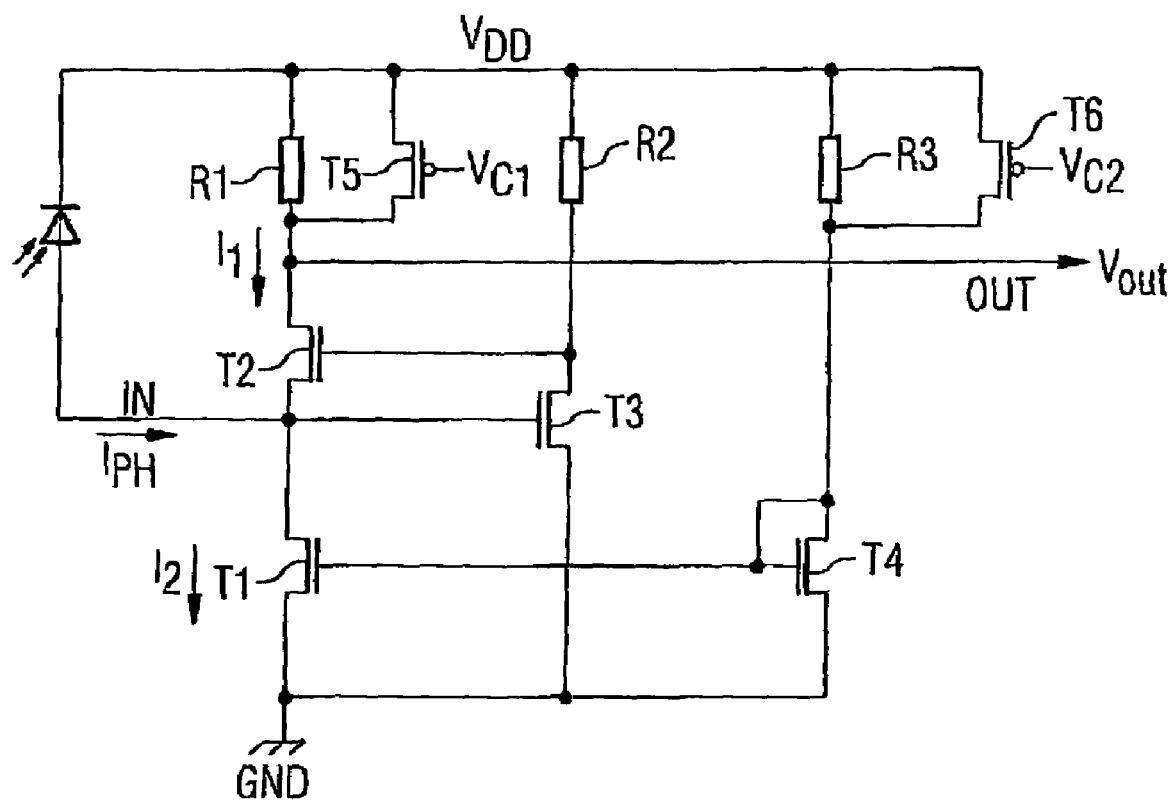
Figure 5:
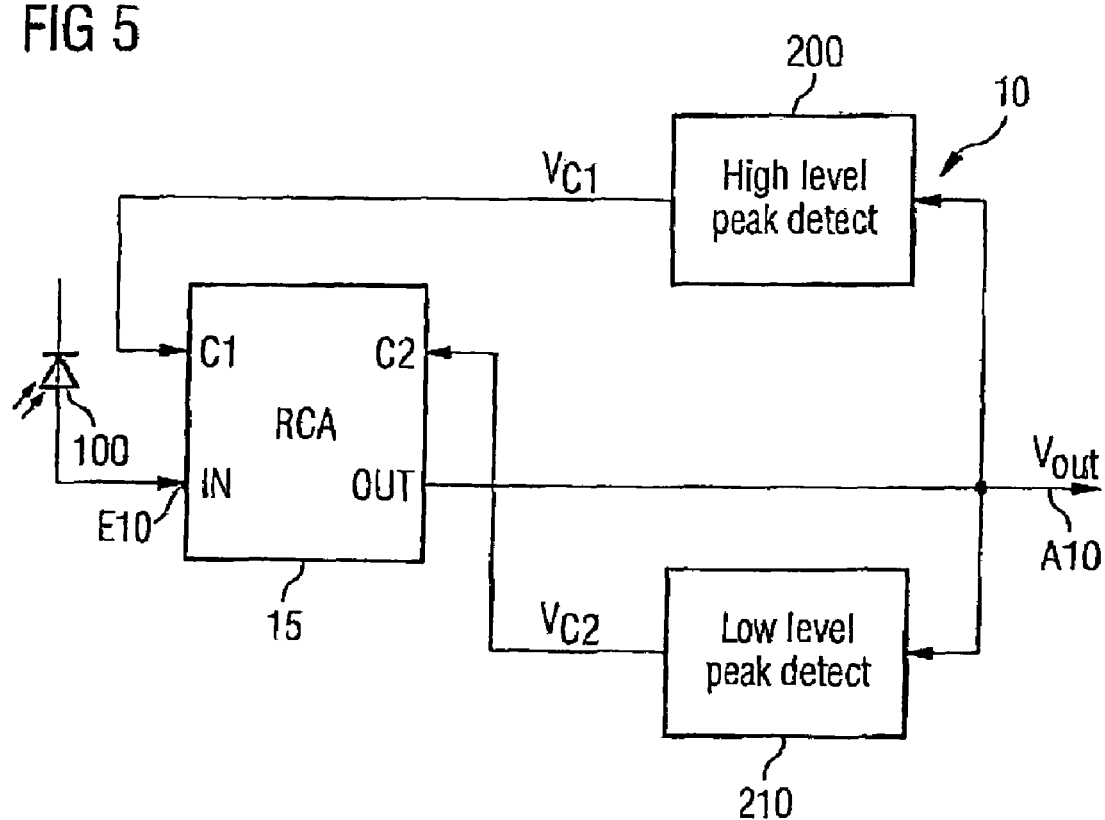
Figure 6:
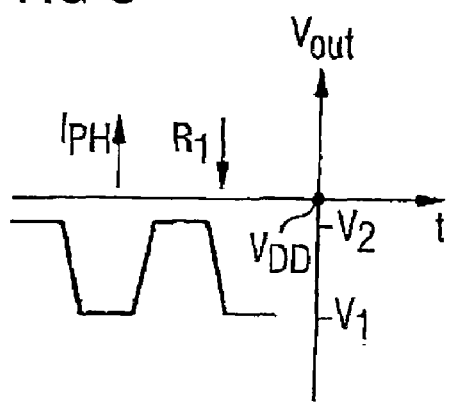
Figure 7:
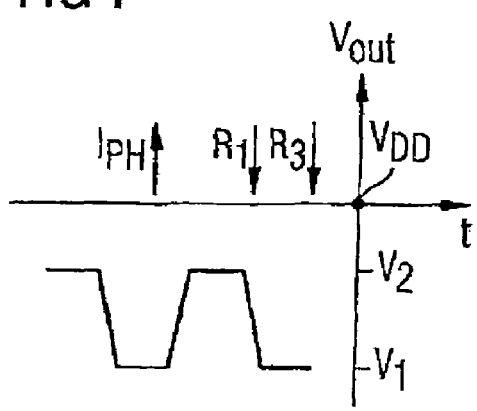

The invention is explained below by way of example with reference to the figures, in which:

FIG. 1 shows an exemplary embodiment of a receiver circuit according to the regulated cascode principle without the control means according to the invention, FIGS. 2 and 3 show the temporal profile of the output signal of the receiver circuit in accordance with FIG. 1, FIGS. 4-5 show an exemplary embodiment of a receiver circuit according to the "regulated cascode" principle with control means according to the invention, FIGS. 6-7 show temporal profiles of the output signal of the receiver circuit in accordance with FIGS. 4 and 5, on the basis of which the functioning of the control means is elucidated, FIGS. 8-9 show an exemplary embodiment of a high level peak detector for the receiver circuit in accordance with FIGS. 4 and 5, and FIGS. 10-11 show an exemplary embodiment of a low level peak detector for the receiver circuit in accordance with FIGS. 4 and 5.

In connection with FIGS. 1 to 12, identical reference symbols are used—if possible—for identical or comparable components or structural parts.

FIG. 1 illustrates a receiver circuit 10 according to the "regulated cascode" principle without the control means according to the invention described in the introduction.

The receiver circuit 10 has, on the input side, a cascode circuit 15 with an input path 20 comprising a series circuit comprising a first transistor T1 and a second transistor T2. The electrical junction point E10 between the first transistor T1 and the second transistor T2 forms an input E10 of the receiver circuit 10 and of the cascode circuit 15.

A first resistor R1 is connected to the series circuit comprising the two transistors T1 and T2, one terminal of said resistor being connected to the supply voltage $V_{DD}$ and the other terminal of said resistor being connected to the transistor series circuit T1/T2. The electrical junction point 30 between the first resistor R1 and the second transistor T2 forms an output A10 of the receiver circuit 10 and of the cascode circuit 15.

A feedback path 50 formed by a series circuit comprising a third transistor T3 and a second resistor R2 is connected to the input path 20. The junction point 60 between the third transistor T3 and the second resistor R2 is connected to a gate terminal 70 of the second transistor T2. The gate terminal 75 of the third transistor T3 is connected to the input E10 of the receiver circuit 10.

The first transistor T1 of the input path 20 is driven by a current mirror path 80. Said current mirror path 80 is formed by a third resistor R3 and a fourth transistor T4. The function of the current mirror path 80 consists in effecting voltage regulation for the gate terminal 85 of the first transistor T1 and thus impressing a fixed drain-source current $I_2$ into the first transistor T1. The current $I_2$ through the first transistor T1 is thus constant.

The following relationships thus hold true:

$$V_{out}=V_{DD}-I_1*R_1$$

$$I_2=I_1+I_{PH}$$

The receiver circuit 10 in accordance with FIG. 1 is distinguished by a very small input resistance at the input E10 on account of the second transistor T2. This will be briefly explained below. For a better understanding of the further explanations, the absence of the feedback path 50 is assumed below in a first explanation step. The functioning with the feedback path 50 is explained in a second explanation step, with the result that the mode of operation of said feedback path becomes clear.

a) Function Without Feedback Path 50:

Without the feedback path 50, the input resistance would be determined by the source impedance of the second transistor T2 and thus by the reciprocal 1/gm of the transconductance gm of the second transistor T2. The input resistance would thus be largely independent of the load resistor R1, so that the latter could be given a relatively large value.

The transconductance gm of the second transistor T2 is proportional to the current I1 through the second transistor T2. In order, then, to achieve a large current I1 and a large transconductance gm, the resistor R1 (for a given supply voltage) would have to be chosen with a small value and/or the supply voltage $V_{DD}$ would have to be chosen with a large value. Both measures are disadvantageous, however, since both measures would increase the noise of the receiver circuit 10.

In order to solve this "noise problem", the feedback path 50 is present, the functioning of which will now be explained.

b) Function With Feedback Path 50:

The feedback path 50 regulates the gate voltage of the second transistor T2. The function of the feedback path 50 consists in reducing the effective input impedance at the input E10 of the receiver circuit 10 by the factor of the gain of the feedback path 50 gm (T3)*R2 (gm(T3): transconductance of the third transistor T3); the transconductance gm(T2) of the second transistor T2 can thus be chosen to be relatively small without the input resistance of the receiver circuit 10 becoming too large. As a result, on account of the feedback path 50, both the current I2 through the first transistor T1 and the transconductance gm(T2) of the second transistor T2 can be chosen with a small value and the load resistor R1 can be chosen with a large value without the input resistance of the receiver circuit 10 increasing: the noise of the receiver circuit 10 is likewise reduced by the feedback path 50 and the sensitivity of the receiver circuit 10 is increased.

What is problematic about the receiver circuit 10 in accordance with FIG. 1, however, is that the dynamic range of the receiver circuit is limited by the current I2 and the available voltage drop across the first resistor R1. This can be discerned in connection with FIG. 2, which illustrates the voltage profile of the output voltage $V_{OUT}$. In the quiescent state, that is to say when no photocurrent $I_{PH}$ flows or the latter assumes its "low" level, the voltage $V_{OUT}$ at the output A10 of the receiver circuit 10 has the value $$V1 = V_{DD} - I1*R1 = V_{DD} - I2*R1$$

the current I1=I2 close to the first resistor R1.

If a photocurrent $I_{PH}$ having a "high" level is then applied, the current I1 through the second transistor T2 decreases since the current I2, which is formed by the current total I1+$I_{PH}$ and flows away to ground through the first transistor T1, remains constant: the output voltage $V_{OUT}$ at the output A10 of the receiver circuit 10 thus rises and assumes the value V2:

$$V2 = V_{DD} - I1*R1 = V_{DD} - (I2 - I_{PH})*R1$$

If the photocurrent $I_{PH}$ in the high level then reached the value I2, current would not be able to flow either through the first resistor R1 or through the second transistor T2, as a result of which the transconductance gm thereof would become small and the input impedance at the input E10 of the receiver circuit 10 would become large. The receiver circuit 10 would thus become relatively slow and function increasingly worse.

The resulting behavior of the receiver circuit 10 in accordance with FIG. 1 in the case of a large photocurrent $I_{PH}$ is discernable in FIG. 3: it can be seen that the high level D2 of the output signal $V_{OUT}$ rises significantly at ($V_{OUT} \approx V_{DD}$), whereas the low level V1 of the output voltage $V_{OUT}$ remains approximately constant.

In order to prevent such an alteration of the behavior of the receiver circuit 10 and in order, moreover, to ensure that the high level V2 and the low level V1 of the output voltage $V_{out}$ at the output A10 of the receiver circuit 10 remain largely constant even when the photocurrent $I_{PH}$, that is to say the "high level" of the photocurrent, rises on average over time, additional control means are provided according to the invention.

An exemplary embodiment of a receiver circuit according to the invention with additional control means 150 is illustrated in FIGS. 4 and 5. FIG. 5 shows the complete receiver circuit 10 as a block diagram and FIG. 4 shows part of this receiver circuit 10—namely the cascode circuit 15—as an electrical circuit diagram in detail.

The additional control means 150 comprise two additional transistors, which are referred to hereinafter as fifth transistor T5 and sixth transistor T6 and modify the cascode circuit 15 (cf. FIG. 4) and also a high level peak detector 200 and a low level peak detector 210, which are connected to the modified cascode circuit 15 (cf. FIG. 5).

The control means 150 act on the cascode circuit 15 in such a way that the high level V2 and the low level V1 of the output signal $V_{OUT}$ of the receiver circuit 10 or of the cascode circuit 15 in each case remain approximately constant.

For this purpose, the fifth transistor T5 is connected in parallel with the first resistor R1, as a result of which a controllable resistor device is formed. The fifth transistor T5 is driven by the high level peak detector 200, to which the output voltage $V_{OUT}$ of the receiver circuit 10 is applied on the input side.

The sixth transistor T6 is connected in parallel with the third resistor T3, as a result of which a controllable resistor device is likewise formed. The gate terminal of said sixth transistor T6 is driven by the low level peak detector 210, at which the output voltage $V_{OUT}$ of the receiver circuit 10 is present on the input side. For the rest, the receiver circuit 10 in accordance with FIGS. 4 and 5 corresponds to the receiver circuit in accordance with FIG. 1.

The receiver circuit 10 in accordance with FIGS. 4 and 5 functions as follows: by applying a control voltage $V_{C1}$ to the fifth transistor T5, it is possible to reduce the resistance R1' of the parallel circuit comprising the first resistor R1 and the fifth transistor T5.

The current I2 through the first transistor T1 can be set by means of the current mirror path 80, by the sixth transistor T6 being driven. The sixth transistor T6 reduces the resistance R3' of the parallel circuit comprising the third resistor R3 and the sixth transistor T6; the current I2 through the first transistor T1 is thereby increased.

The influence of the two transistors T5 and T6 is explained below with reference to FIGS. 2, 3, 6 and 7:

FIG. 2 shows the output voltage $V_{OUT}$ at the output A10 of the receiver circuit 10 in the case of a relatively small photocurrent $I_{PH}$ of the photodiode 100 connected on the input side. The high level V2 and the low level V1 of the output voltage $V_{OUT}$ are depicted in FIG. 2.

If the photocurrent $I_{PH}$ of the photodiode 100 then increases, the high level V2 of the output voltage $V_{OUT}$ will rise, while the low level V1 of the output voltage $V_{OUT}$ largely remains the same. This could have the effect—as already explained above—of the high level V2 becoming too large and the current through the second transistor T2 becoming too small. In order to counteract this development, the resistance R1' of the parallel circuit comprising the resistor R1 and the fifth transistor T5 is reduced (cf. FIG. 6). As a result, the output level or the voltage drop at R1 is reduced in a first step.

Both the high level V2 and the low level V1 increase on account of the reduction of the resistance R1'. The dynamic range $D_{dyn}$ of the receiver circuit 10 remains small, however, since it is still limited by the current I2 of the first transistor T1. Therefore, it is additionally necessary to increase the current I2 of the first transistor T1 in order to increase the dynamic range. The dynamic range $D_{dyn}$ is defined as the ratio of maximum permissible to minimum permissible input current (=sensitivity limit), that is to say $I_{PH,max}/I_{PH,min}$ at the input of the receiver circuit 10.

The current I2 of the first transistor T1 is increased by means of a reduction of the resistance R3' of the parallel circuit comprising the third resistor R3 and the sixth transistor T6, by the transistor T6 being correspondingly "switched on".

As a result, the signal profile of the output voltage $V_{OUT}$ shown in FIG. 7 is thus achieved: the high level V2 and the low level V1 are both reduced and then approximately correspond to the high and low levels illustrated in FIG. 2 in the case of small photocurrents $I_{PH}$. The described driving of the fifth and sixth transistors thus achieves a profile of the output signal $V_{out}$ which is largely independent of whether a small or large photocurrent is present as "high level" at the input E10 of the receiver circuit 10.

If, moreover, only the current I2 through the first transistor T1 were increased without reducing the resistance R1' in the input path 20, the voltage difference between the high level V2 and the low level V1 would not be reduced: the drain-source voltage at the second transistor T2 would become too small, which would in turn impair the function of said transistor T2—as already explained—since the gain of this transistor might fall to zero.

The regulation of the control voltages $V_{C1}$ and $V_{C2}$ at the two transistors T5 and T6 is effected by the high peak level detector 200 and the low level peak detector 210 (cf. FIG. 5). The high level peak detector 200 determines the respective temporal peak value from the temporal profile of the output voltage $V_{OUT}$ at the output A10 of the receiver circuit 10 and generates a control voltage $V_{C1}$ for the fifth transistor T5 from said peak value. Thus, the larger the high level of the output voltage $V_{OUT}$ at the output A10 of the receiver circuit 10 becomes, the more the fifth transistor T5 is turned on and the resistance R1' is reduced.

The low level peak detector 210 determines in each case the temporal minimum value of the output voltage from the temporal profile of the output voltage $V_{OUT}$ at the output A10 of the receiver circuit 10 and generates a control voltage $V_{C2}$ for the sixth transistor T6 from said minimum value. Thus, the larger the low level V1 of the output voltage $V_{OUT}$ at the output A10 of the receiver circuit 10 becomes, the more the sixth transistor T6 is turned on and the resistance R3' is reduced; this leads to a rise in the current I2 through the first transistor T1 and subsequently to a reduction of the low level V1 of the output voltage $V_{OUT}$.

Figure 10:
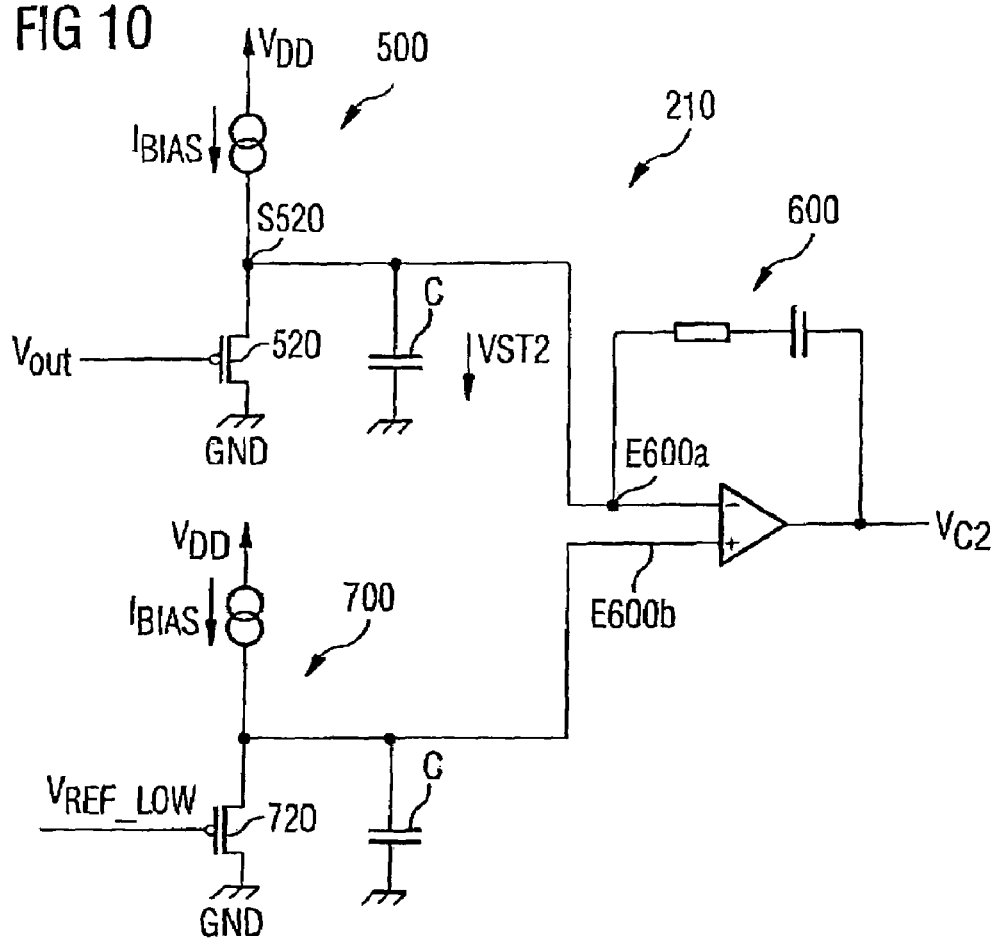

The construction of the high level peak detector 200 is shown by way of example in greater detail in FIG. 8 and the construction of the low level peak detector 210 is shown by way of example in greater detail in FIG. 10.

It is evident in FIG. 8 that the high level peak detector 200 has a "source follower circuit" 205 with an n-channel transistor 220 on the input side. The source terminal S220 of the transistor 220 is connected to a parallel circuit comprising a current source $I_{BIAS}$ and an integrating capacitor C. The output voltage $V_{OUT}$ of the receiver circuit 10 is present at the input of the source follower circuit 205.

A differential amplifier 300 is additionally evident in FIG. 8, the source follower circuit 205 being connected to one terminal E300a of said differential amplifier. A reference source follower circuit 400 comprising an n-channel transistor 420, a capacitor C and a current source $I_{BIAS}$ is connected to a second terminal E300b of the differential amplifier 300. The reference source follower circuit 400 and the source follower circuit 205 are preferably structurally identical.

By applying a predetermined reference voltage $V_{ref-high}$ to the reference source follower circuit 400, it is possible to establish the extent to which the control voltage $V_{C1}$ at the output of the high level peak detector 200 is to depend on the output voltage $V_{out}$ of the receiver circuit 10. In concrete terms, the reference voltage $V_{ref-high}$ specifies that high level of the output voltage $V_{out}$ from which a "counter-control" or "readjustment" is to be effected by the control means 150. The reference voltage $V_{ref-high}$ thus prescribes a regulation threshold or a minimum threshold for the high level of the output voltage $V_{out}$ from which "counter-control" is effected.

Consequently, a temporal profile of the control voltage $V_{C1}$ as is illustrated in FIG. 9 results at the output of the high level peak detector 200. It is evident that the high level peak detector 200 always outputs as control voltage $V_{C1}$ a voltage value that depends on the maximum value of the voltage $V_{out}$—that is to say the high level. The slight temporal fault in the control voltage $V_{C1}$ between two successive high levels of the output voltage $V_{out}$ is caused by the BIAS current source $I_{BIAS}$ and may be defined in accordance with the desired regulation time constant through the dimensioning of the capacitance C and the current $I_{BIAS}$.

FIG. 10 reveals in detail the low level peak detector 210 comprising a "source follower circuit" 500 with a p-channel transistor 520 on the input side. The source terminal S520 of the transistor 520 is connected to a series circuit comprising a current source $I_{BIAS}$ and an integrating capacitor C. The output voltage $V_{OUT}$ of the receiver circuit 10 is present at the input of the source follower circuit 500.

A differential amplifier 600 is additionally evident in FIG. 10, the source follower circuit 500 being connected to one terminal E600a of said differential amplifier. A reference source follower circuit 700 comprising a p-channel transistor 720, a capacitor C and a current source $I_{BIAS}$ is connected to a second terminal E600b of the differential amplifier 300. The reference source follower circuit 700 and the source follower circuit 500 are preferably structurally identical.

By applying a predetermined reference voltage $V_{ref-low}$ to the reference source follower circuit 700, it is possible to establish the extent to which the control voltage $V_{C2}$ at the output of the low level peak detector 210 is to depend on the output voltage $V_{out}$ of the receiver circuit 10. In concrete terms, the reference voltage $V_{ref-low}$ specifies that low level of the output voltage $V_{out}$ from which a "counter-control" or "readjustment" is to be effected by the control means 150. The reference voltage $V_{ref-low}$ thus prescribes a regulation threshold or a minimum threshold for the low level of the output voltage $V_{out}$ from which "counter-control" is effected.

Figure 11:
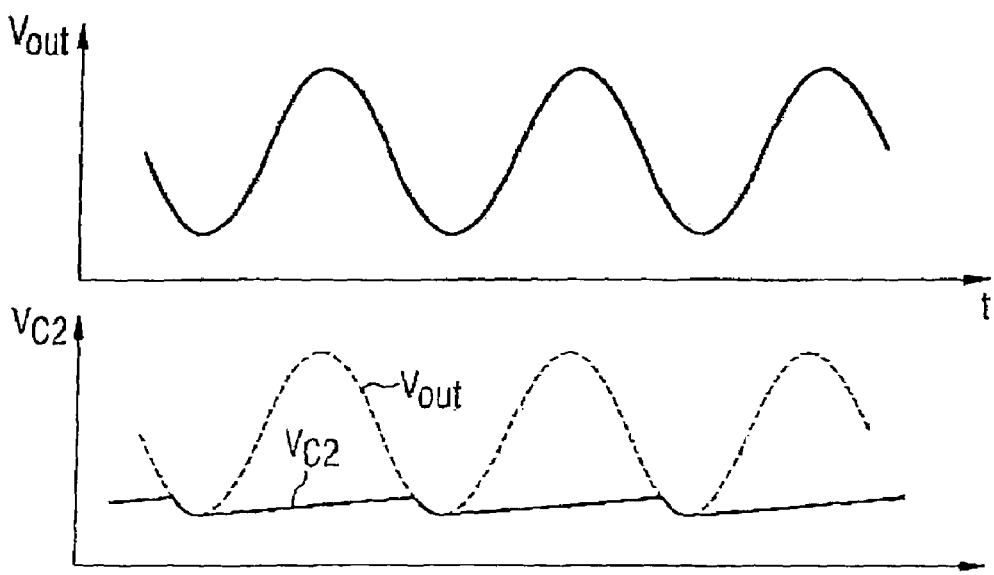

Consequently, a temporal profile of the control voltage $V_{C2}$ as is illustrated in FIG. 11 results at the output of the low level peak detector 210. It is evident that the low level peak detector 210 always outputs as control voltage $V_{C2}$ a voltage value that depends on the minimum value of the voltage $V_{out}$—that is to say the low level. The slight temporal fault in the control voltage $V_{C1}$ between two successive low levels of the output voltage $V_{out}$ is caused by the BIAS current source $I_{BIAS}$ and may be defined in accordance with the desired regulation time constant through the dimensioning of the capacitance C and the current $I_{BIAS}$.

The invention claimed is:

1. A receiver circuit for a reception element, comprising:
   a cascode circuit on an input side of the receiver circuit which generates an output signal from a reception signal of the reception element, and
   control means operatively coupled to the cascode circuit and configured to counteract overdriving the cascode circuit as a result of one or more excessively large input signals from the reception element,
   the control means configured to counteract an increase in a high level of the output signal of the cascode circuit,
   the cascode circuit comprising an input path with a first transistor and a first resistor, and
   the cascode circuit comprising a feedback path connected to the input path, where the feedback path comprises a series circuit comprising a third transistor and a second resistor, where a gate terminal of the third transistor is connected to an input of the input path.

2. The receiver circuit of claim 1, the control means configured to counteract an increase in a low level of the output signal of the cascode circuit.

3. The receiver circuit of claim 1, the control means configured to become active in the event of a predetermined maximum high level being exceeded.

4. The receiver circuit of claim 1, the control means reducing the resistance of the first resistor and also increasing the transistor current of the first transistor in the event of a rise in the high level of the output signal.

5. The receiver circuit of claim 4, the control means increasing the resistance of the first resistor and also reducing the transistor current of the first transistor in the event of a fall in the high level of the output signal.

6. The receiver circuit of claim 1, the first resistor and the first transistor being connected in series.

7. The receiver circuit of 6, a terminal of the first resistor forming an output of the receiver circuit and a terminal of the first transistor forming an input of the receiver circuit.

8. The receiver circuit of claim 1, the control means acting on the cascode circuit based upon at least one of an output voltage of the receiver circuit and an output current of the receiver circuit.

9. The receiver circuit of claim 1, an input resistance of the input path being reduced by the feedback path.

10. The receiver circuit of claim 1, the cascode circuit comprising a current mirror path connected to the input path to set a current through the first transistor.

11. The receiver circuit of claim 10, the current mirror path being formed by a third resistor and a fourth transistor.

12. The receiver circuit of claim 11, the first resistor and the third resistor being controllable resistors.

13. The receiver circuit of claim 12, the controllable first resistor being formed by a parallel circuit comprising a nonreactive resistor having a fixedly predetermined resistance and a fifth transistor connected in parallel therewith.

14. The receiver circuit of claim 12, the controllable third resistor being formed by a parallel circuit comprising a nonreactive resistor having a fixedly predetermined resistance and a sixth transistor connected in parallel therewith.

15. The receiver circuit of claim 1, the control means comprising a high level peak detector device.

16. The receiver circuit of claim 15, the cascode circuit comprising an input path with a first transistor and a first resistor.

17. The receiver circuit of claim 16, the first resistor being a controllable resistor.

18. The receiver circuit of claim 17, the controllable first resistor being formed by a parallel circuit comprising a nonreactive resistor having a fixedly predetermined resistance and a fifth transistor connected in parallel therewith.

19. The receiver circuit of claim 18, the high level peak detector device driving the fifth transistor.

20. The receiver circuit of claim 19, the high level peak detector device comprising a transistor, a capacitor and a current source.

21. The receiver circuit of claim 1,
the cascode circuit comprising a current mirror path connected to the input path to set a current through the transistor,
the current mirror path being formed by a third resistor and a fourth transistor,
the third resistor being formed by a parallel circuit comprising a nonreactive resistor having a fixedly predetermined further resistance and a sixth transistor connected in parallel therewith,
the control means comprising a low level peak detector device, and
the low level peak detector device driving the sixth transistor.

22. The receiver circuit of claim 21, the low level peak detector device comprising a transistor, a capacitor and a current source.

23. A receiver circuit for a reception element, comprising:
a cascode circuit on an input side of the receiver circuit which generates an output signal from a reception signal of the reception element, and
control means operatively coupled to the cascode circuit and configured to counteract overdriving the cascode circuit as a result of one or more excessively large input signals from the reception element,
the control means configured to counteract an increase in a high level of the output signal of the cascode circuit,
the cascode circuit comprising an input path with a first transistor and a first resistor connected in series,
a terminal of the first resistor forming an output of the receiver circuit and a terminal of the first transistor forming an input of the receiver circuit,
the first transistor and a second transistor are comprised within a series circuit of the input path of the cascode circuit,
the resistor is connected to the second transistor,
an electrical junction point between the first transistor and the second transistor forms the input of the receiver circuit, and
an electrical junction point between the first resistor and the second transistor forms the output of the receiver circuit.

* * * * *